United States Patent
Verbeyst et al.

(10) Patent No.: US 9,581,630 B2
(45) Date of Patent: Feb. 28, 2017

(54) METHOD FOR CALIBRATING A VECTOR NETWORK ANALYZER

(71) Applicant: NATIONAL INSTRUMENTS CORPORATION, Austin, TX (US)

(72) Inventors: Frans Verbeyst, Merchtem (BE); Marc Vanden Bossche, Bornem (BE)

(73) Assignee: NATIONAL INSTRUMENTS CORPORATION, Austin, TX (US)

(*) Notice: Subject to any disclaimer, the term of this patent is extended or adjusted under 35 U.S.C. 154(b) by 568 days.

(21) Appl. No.: 14/180,425

(22) Filed: Feb. 14, 2014

(65) Prior Publication Data

US 2014/0236517 A1    Aug. 21, 2014

Related U.S. Application Data (60) Provisional application No. 61/765,186, filed on Feb. 15, 2013.

(51) Int. Cl.
  *G01R 27/28* (2006.01)
  *G01R 35/00* (2006.01)

(52) U.S. Cl.
  CPC .............. *G01R 27/28* (2013.01); *G01R 35/00* (2013.01)

(58) Field of Classification Search
  CPC ................................ G01R 27/28; G01R 35/00
  See application file for complete search history.

(56) References Cited

U.S. PATENT DOCUMENTS

| | | | |
|---|---|---|---|
| 5,578,932 A | 11/1996 | Adamian | |
| 6,614,237 B2 | 9/2003 | Ademian | |
| 6,826,506 B2 | 11/2004 | Adamian | |
| 6,920,407 B2 | 7/2005 | Adamian | |
| 7,019,536 B1 | 3/2006 | Anderson | |
| 7,030,625 B1 | 4/2006 | Boudiaf | |
| 7,130,756 B2 | 10/2006 | Heuermann | |
| 2007/0194776 A1* | 8/2007 | Bossche | G01R 27/28 324/76.22 |

(Continued)

OTHER PUBLICATIONS

Ferrero, Andrea, Umberto Pisani, and Kevin J. Kerwin, "A New Implementation of a Multiport Automatic Network Aanalyzer," IEEE Trans. Microwave Theory Tech., vol. 40, No. 11, pp. 2078-2085, Nov. 1992 (8 pages).

(Continued)

*Primary Examiner* — Manuel L Barbee
(74) *Attorney, Agent, or Firm* — Meyertons Hood Kivlin Kowert & Goetzel, P.C.; Jeffrey C. Hood (57) ABSTRACT

A method for calibrating a vector network analyzer may include performing a first set of measurements on a first port of a plurality of ports and determining error coefficients for the first port. The error coefficients may be used to obtain a first calibrated port. For an uncalibrated port of the plurality of ports, a connection via a known through between an already calibrated port and the uncalibrated port may be established and a first signal from a first signal source may be applied to the calibrated port and a second signal form a second signal source may be applied to the uncalibrated port. A further set of measurements with respect to the uncalibrated port may be performed and error coefficients may be determined for the uncalibrated port based on the further set of measurements and relation to error coefficients of the calibrated port.

11 Claims, 4 Drawing Sheets

(56) References Cited

U.S. PATENT DOCUMENTS

2007/0236230 A1* 10/2007 Tanbakuchi ........... G01R 27/28
                                                    324/650
2008/0125999 A1*  5/2008 Rumiantsev ........... G01R 35/00
                                                    702/107
2011/0191046 A1*  8/2011 Pupalaikis .............. H04L 43/50
                                                    702/66

OTHER PUBLICATIONS

Ferrero, Andrea and Fernando Sanpietro, "Multiport Vector Network Analyzer Calibration: A General Formulation," IEEE Transactions on Microwave Theory and Techniques, vol. 42, No. 12, Dec. 1994 (7 pages).

Rytting, Doug, "Network Analyzer—Error Models and Calibration Methods," Agilent Technologies, <http://na.tm.agilent.com/faq/NAModels.pdf> (51 pages).

Ferrero, Andrea and Umberto Pisani, "Two-Port Network Analyzer Calibration Using an Unknown 'Thru'," IEEE Microwave and Guided Wave Letters, vol. 2, No. 12, pp. 505-507, Dec. 1992 (3 pages).

Eul, Hermann-Josef, "Reducing the Number of Calibration Standards for Network Analyzer Calibration," IEEE Transactions on Instrumentation and Measurement, vol. 40, Issue 4, pp. 732-735, Aug. 1991 (4 pages).

Rolfes, Ilona and Burkhard Schiek, "Multiport Method for the Measurement of the Scattering Parameters of N-Ports," IEEE Transactions on Microwave Theory and Techniques, vol. 53, No. 6, pp. 1990-1996, Jun. 2005 (7 pages).

Verbeyst, Frans and Marc Vanden Bossche, "Speeding Up N-port VNA Calibration Eliminating One-Port Calibrations," Feb. 14, 2013 (5 pages).

* cited by examiner

METHOD FOR CALIBRATING A VECTOR NETWORK ANALYZER

PRIORITY DATA

This application claims benefit of priority to U.S. Provisional Application Ser. No. 61/765,186, titled "Speeding Up N-port VNA Calibration Eliminating One-Port Calibrations", filed Feb. 15, 2013, whose inventors were Frans Verbeyst and Marc Vanden Bossche, which is hereby incorporated by reference in its entirety as though fully and completely set forth herein.

FIELD OF THE INVENTION

The present invention is generally related to the field of calibration techniques for vector network analyzers. More in particular, the invention is concerned with calibration techniques for multi-port vector network analyzers.

BACKGROUND OF THE INVENTION

Vector Network Analyzers (VNAs) have the potential to provide exceptional accuracy. One of the reasons for this exceptional performance is that a user periodically performs a calibration before making a measurement. Without proper user calibration, taking full advantage of VNA measurement accuracy is almost impossible. VNAs perform ratio-ed measurements. S-parameters $S_{ij}$ are defined as the ratio of the reflected or transmitted signal (through the device under test) at port i and the incident wave at port j, provided that the input signal at all other ports is zero.

Due to the increased complexity of radio frequency (RF) devices and the ongoing evolution towards differential topologies, the number of RF ports in such devices is no longer limited to two. With the advent of these new RF devices which have an increasing number of ports, there is a growing need for Vector Network Analyzers with an equally increased number of ports. This trend is further reinforced in view of the current need for simultaneous testing of several devices in production. The present invention is concerned with the calibration of such multi-port vector network analyzers.

A standard user calibration accounts for 10 or 12 sources of systematic errors being present in a VNA. Consider a forward measurement path, where the signal generator is applied to port 1 into the device under test. The first source of systematic errors is the tracking term, or the frequency response of the signal paths for the transmission and reflection measurement paths. Next is the source and load impedance match at the input and output of the device, respectively. Isolation is the small amount of leakage radiating from port 1 and being measured at port 2. Together with the coupler directivity this yields a total of six error terms in the forward path. Six similar terms obtained when the signal source is applied on port 2 for the reverse measurement path, give 12 error terms in total. If isolation can be neglected, 10 error terms remain.

Doing so allows determining raw S-parameters $S_{ijm}$ from the forward and reverse measurements. The forward measurements yield:

$S_{11m} = b_0/a_0 = f_1(e_{kl}, S_{ij})$ $S_{21m} = b_3/a_0 = f_2(e_{kl}, S_{ij})$

The reverse measurements yield:

$S_{22m} = b'_3/a'_3 = f_3(e'_{kl}, S_{ij})$ $S_{12m} = b'_0/a'_3 = f_4(e'_{kl}, S_{ij})$

In the above expressions the quantities $e_{kl}$ and $e'_{kl}$ represent the error terms in forward and reverse direction, respectively. To obtain the calibrated S-parameters 10 or 12 error terms are applied to the above raw S-parameter measurements:

$S_{ij} = F(e_{kl}, e'_{kl}, S_{ijm})$

Traditionally, Short-Open-Load-Through (SOLT) is one of the best-known calibration methods at RF frequencies. It uses a well-defined short, open, and load as termination. These are referred to as calibration elements or calibration standards. One by one, each standard is connected at the reference plane and is measured by the VNA. When these steps are completed, the two reference planes are connected together to form a through connection in order to relate the error coefficients at the different ports. SOLT is sometimes also referred to as TOSM (Through-Open-Short-Match).

When extending the above to an N-port VNA, the connection of a Short, Open and Load is typically performed at each port, which is tedious and error-prone. Next a through connection is realized, at least between the first port and every other port. Other implementations require a through between each port combination. The through can either be fully known or unknown. In the latter case it is assumed to be reciprocal.

The procedure explained above maps uncalibrated S-parameters to calibrated S-parameters. Another approach starts from a Short-Open-Load (SOL)-based one-port calibration being performed at each port in combination with an error model as specified by $$\begin{pmatrix} a_l \\ b_l \end{pmatrix} = K_l \begin{pmatrix} 1 & \alpha_l \\ \beta_l & \gamma_l \end{pmatrix} \begin{pmatrix} x_{l1m} \\ x_{l2m} \end{pmatrix} \quad (1)$$

This error model uses a wave formalism concept and maps the raw quantities $x_{l1m}$ and $x_{l2m}$, measured at port 1 to the calibrated incident and reflected waves $a_l$ and $b_l$ at that port. Given three known and sufficiently different terminations $$\Gamma_l = \frac{b_l}{a_l}$$

(such as Short, Open and Load) and the corresponding measured raw quantities, one simply needs to solve a set of linear equations to retrieve $\alpha_1$, $\beta_1$ and $\gamma_1$. Sufficiently different refers to the fact that the different terminations must allow extracting the error coefficients $\alpha_1$, $\beta_1$ and $\gamma_1$ in a numerically well-conditioned way.

Next the $K_l$ parameters can be extracted by connecting a known or an unknown reciprocal through between port 1 and port l. However, using only a relative calibration, one of the parameters $K_l$ cannot be determined and typically it is set to unity at port 1. The latter is not an issue in order to obtain calibrated ratios such as S-parameters. For this purpose $a_{lm}$ and $b_{lm}$ are defined as $$\begin{pmatrix} a_{lm} \\ b_{lm} \end{pmatrix} = \begin{pmatrix} 1 & \alpha_l \\ \beta_l & \gamma_l \end{pmatrix} \begin{pmatrix} x_{l1m} \\ x_{l2m} \end{pmatrix} \Rightarrow \begin{pmatrix} a_l \\ b_l \end{pmatrix} = K_l \begin{pmatrix} a_{lm} \\ b_{lm} \end{pmatrix} \quad (2)$$

By performing a measurement in the forward (indicated by superscript F) and reverse direction (indicated by superscript R) while inserting a known through or an unknown reciprocal through between port 1 and port 2, $K_2$ can be extracted using:

$$\begin{pmatrix} b_1 \\ b_2 \end{pmatrix} = \begin{pmatrix} S_{11} & S_{12} \\ S_{12} & S_{22} \end{pmatrix} \begin{pmatrix} a_1 \\ a_2 \end{pmatrix} \Rightarrow \begin{pmatrix} b_{1m} \\ b_{2m} \end{pmatrix} = \begin{pmatrix} S_{11} & \frac{K_2}{K_1}S_{12} \\ \frac{K_1}{K_2}S_{12} & S_{22} \end{pmatrix} \begin{pmatrix} a_{1m} \\ a_{2m} \end{pmatrix} \quad (3)$$

from which is obtained $$\begin{pmatrix} b_{1m}^F & b_{1m}^R \\ b_{2m}^F & b_{2m}^R \end{pmatrix} = \begin{pmatrix} S_{11} & \frac{K_2}{K_1}S_{12} \\ \frac{K_1}{K_2}S_{12} & S_{22} \end{pmatrix} \begin{pmatrix} a_{1m}^F & a_{1m}^R \\ a_{2m}^F & a_{2m}^R \end{pmatrix} \quad (4)$$

In the case of an unknown through, solving the above equation provides $S_{11}$, $S_{22}$, $$S'_{12} = \frac{K_2}{K_1}S_{12}$$

and $$S'_{21} = \frac{K_1}{K_2}S_{12}.$$

Hence $S_{12} = \sqrt{S'_{12} \cdot S'_{21}}$, which requires proper root selection. The latter can be found by modelling the through as a lossy delay, by phase unwrapping or any other suitable approach. Finally $K_2$ is obtained as $S'_{12}/S_{12}$ keeping in mind that $K_1$ was chosen to be unity. This procedure can be repeated for all remaining ports and is as such easily scalable with respect to the number of ports.

However, the above approach requires a considerable number of human interventions to connect the different calibration elements to the respective ports. Furthermore this process is error-prone because of the possibility to connect another calibration element than the requested or assumed one.

SUMMARY OF THE INVENTION

It is an object of embodiments of the present invention to provide for a method for calibrating a multi-port vector network analyzer, whereby the number of human interactions is minimized.

The above objective is accomplished by the solution according to the present invention.

In a first aspect the invention relates to a method for calibrating a vector network analyzer. The vector network analyzer comprises a plurality of ports and a plurality of signal sources. The method comprises:
performing a first set of measurements using a set of known terminations connected to a first port of the plurality of ports, so that a well-conditioned set of equations is obtained,
determining error coefficients for the first port by solving this well-conditioned set of equations, thereby obtaining a first calibrated port,
for an uncalibrated port of the plurality of ports performing:
establishing a connection via a known through between an already calibrated port and the uncalibrated port,
applying to the already calibrated port a first signal from a first source of the plurality of signal sources and to the uncalibrated port a second signal from a second source,
performing a further set of measurements using a set of terminations being realized with respect to the uncalibrated port by manipulating the first and second source so that a further well-conditioned set of equations is obtained,
determining error coefficients for the uncalibrated port by solving the further well-conditioned set of equations, including their relation with respect to the error coefficients at the already calibrated port, such that the uncalibrated port becomes a calibrated port.

The proposed solution indeed allows for a substantial reduction of the number of user interactions during the calibration process. The proposed technique capitalizes on the availability of multiple signal sources in a vector network analyzer. The vector network analyzer is assumed to comprise at least two signal sources. It further has a plurality of ports. A first port is calibrated using a set of known terminations, typically, but not necessarily, a short, open and load. The terminations must be sufficiently different so that a well-conditioned set of equations is obtained to calculate the error coefficients for the first port from the performed measurements. Next for a remaining uncalibrated port, preferably for all remaining ports, a same procedure is carried out, wherein a connection is made via a known through between a port that has already been calibrated (i.e. the first calibrated port or one of the further ports that already have been calibrated) and the port to be calibrated next, a signal from a first source is applied to the already calibrated port and a signal from a second source to the port still to be calibrated. Then measurements are performed with some terminations realized with respect to the port to be calibrated in an active way by manipulating the first and second source so that a further well-conditioned set of equations is obtained. The error coefficients for the port to be calibrated are obtained by solving this set of equations.

In a preferred embodiment the second signal source is phase-controllable with respect to the first signal source. In a more specific embodiment the phase of the second signal source is changed with respect to the first signal source by setting the second signal source shortly to a different frequency and then applying the original frequency again.

In another embodiment the first and/or the further set of measurements correspond to applying the equivalent of a short, an open and a load.

In one embodiment manipulating the first and second source comprises adapting amplitude and/or phase of the applied signals. In another embodiment manipulating the first and second source comprises disabling the first or second signal source.

In a particular embodiment the second source is obtained by reusing the first source in combination with a splitting means for splitting the second signal and adjustment means to adjust amplitude and/or phase of the second signal with respect to the first signal.

In one embodiment an unknown reciprocal through is used instead of the known through, whereby the unknown reciprocal through is connected between two ports of the plurality of ports. Instead of calibrating the first port the following procedure is carried out. A set of measurements is performed with a set of known terminations connected to the two ports. An additional set of measurements is performed with the unknown reciprocal through connected between the two ports. In this way a well-conditioned set of equations is obtained. Error coefficients are determined for the two ports by solving that set of equations, which yields two calibrated ports. Furthermore this set of equations allows determining the S-parameters of the unknown reciprocal through, so that it becomes a known through when used between an already calibrated port (either the first port or a port that has been calibrated before in the procedure) and a yet uncalibrated port.

In another aspect the invention relates to a method for calibrating a vector network analyzer. The vector network analyzer comprises a plurality of ports and a plurality of signal sources. The method comprises:

performing a first set of measurements using a set of known terminations connected to a first port of the plurality of ports so that a well-conditioned set of equations is obtained, determining error coefficients for the first port by solving the well-conditioned set of equations, thereby obtaining a first calibrated port, for an uncalibrated port of the plurality of ports performing:

establishing a connection via an unknown reciprocal through between an already calibrated port and the uncalibrated port, applying to the already calibrated port a first signal from a first source of the plurality of signal sources and to the uncalibrated port a second signal from a second source of the plurality of signal sources, performing an extended set of measurements using a set of terminations being realized with respect to the uncalibrated port by manipulating the first and second source so that a further well-conditioned extended set of equations is obtained, determining error coefficients for the uncalibrated port by solving this further well-conditioned extended set of equations, including their relation with respect to the error coefficients at the already calibrated port, such that the uncalibrated port becomes a calibrated port.

The above method differs from the previously presented method in that the through connection does not need to be known and can differ from port to port. In order to deal with the unknown reciprocal through, one now has to solve a non-linear set of equations instead of a linear set and one has to collect more independent measurements. Note that in this approach in principle also the S-parameters of the unknown reciprocal through are determined, but they are not used beyond the fact that they are part of the unknowns next to the error coefficients. If needed, the obtained S-parameters can be inspected as verification.

In yet another aspect the invention relates to a method for determining S-parameters of a reciprocal frequency translating device with a vector network analyzer, said vector network analyzer comprising a plurality of ports and a plurality of signal sources. The method comprises:

calibrating at least two ports of the vector network analyzer using the method as previously described, connecting, while a local oscillator is connected to the frequency translating device, a first port of the frequency translating device to a first calibrated port of the vector network analyzer and a second port of the frequency translating device to a second calibrated port of the vector network analyzer, applying a first signal from a first source of the plurality of signal sources to the first calibrated port and a second signal from a second source of the plurality of signal sources to the second calibrated port, synthesizing a set of terminations with respect to the second port of the frequency translating device by manipulating the first and second source so that a well-conditioned set of equations is obtained, extracting the S-parameters of the frequency translating device by solving the well-conditioned set of equations.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The calibration method according to the present invention starts from a standard calibration approach using the waveform formalism as described in the background section, which is applied to only one port in case of a known through or to two ports in case of an unknown reciprocal through. As a result, one is able to obtain error-corrected mismatch values at a first port and to use the known or extracted S-parameters of the through to transfer this error-corrected information to each of the remaining ports, assuming the same through is used in case of an unknown reciprocal through. For these ports an active equivalent of a Short, Open and Load (or other sufficiently different terminations) can then be synthesized in case a first source is available at a first port while another source is routed to any remaining port, one port at the time, with the through connected in between the ports.

Given the S-parameters of the through that was inserted between port 1 and port k, it is possible to retrieve the error-corrected mismatch $$\Gamma_k = \frac{b_k}{a_k}$$

at port k starting from the corresponding mismatch $$\Gamma_1 = \frac{a_1}{b_1}$$

at port 1 as follows:

$$\begin{cases} b_1 = S_{11} \cdot a_1 + S_{12} \cdot a_k \\ b_k = S_{21} \cdot a_1 + S_{22} \cdot a_k \end{cases}$$

$$\Leftrightarrow \begin{cases} a_k = -\frac{S_{11}}{S_{12}} \cdot a_1 + \frac{1}{S_{12}} \cdot b_1 \\ b_k = \frac{S_{21} \cdot S_{12} - S_{11} \cdot S_{22}}{S_{12}} \cdot a_1 + \frac{S_{22}}{S_{12}} \cdot b_1 \end{cases}$$

$$\Leftrightarrow \Gamma_k = \frac{b_k}{a_k} = \frac{(S_{21} \cdot S_{12} - S_{11} \cdot S_{22}) \cdot \Gamma_1 + S_{22}}{1 - S_{11} \cdot \Gamma_1}$$

By synthesizing at least three different $\Gamma_k$ it is possible to extract $\alpha_k$, $\beta_k$, and $\gamma_k$ similar to what is done as part of a standard calibration.

The remaining fourth parameter $K_k$ is obtained by performing a forward measurement, applying a signal at port 1 and disabling the source at port k. Using the terminology as defined by (2) and again using the knowledge of the S-parameters of the through:

$$b_k = S_{21} \cdot a_1 + S_{22} \cdot a_k$$

$$\Leftrightarrow$$

$$K_k \cdot b_{km}^F = S_{21} \cdot K_1 \cdot a_{1m}^F + S_{22} \cdot K_k \cdot a_{km}^F$$

$$\Leftrightarrow$$

$$K_k = \frac{S_{21} \cdot a_{1m}^F}{b_{km}^F - S_{22} \cdot a_{km}^F} \cdot K_1$$

Typically $K_1$ is chosen to be 1. Due to the fact that also this procedure is performed one port at the time, it is easily scalable with respect to the number of ports.

Preferably the phase of the first source is adjustable with respect to the second source in order to synthesize sufficiently different mismatches in a controlled way as an active equivalent of a Short and an Open. When phase adjustment is not supported, a different, but a priori unknown and as such possibly less ideal, phase relationship between both sources can be achieved by changing the frequency of one or both sources and then returning to the original frequency.

In an embodiment of the invention an unknown reciprocal through is used instead of a known through. The unknown reciprocal through is connected between two ports of the vector network analyzer. The calibration of the first port is replaced by:
- performing a set of measurements using a set of known terminations connected to the two ports and an additional set of measurements with the unknown reciprocal through connected between the two ports, so that a well-conditioned set of equations is obtained,
- determining error coefficients for the two ports, by solving this well-conditioned set of equations, thereby obtaining two calibrated ports,
- determining the S-parameters of the unknown reciprocal through such that it becomes a known through when used between an already calibrated port and a yet to be calibrated port of the plurality of ports.

An alternative realization of the proposed calibration method is to replace the source at port 1, which is applied in order to synthesize at port k different terminations while a signal is applied at port k, by a set of passive terminations. One has to take care that the resulting terminations at port k be sufficiently different taking into account the insertion loss of the test set at port 1.

In another aspect the invention relates to a method for calibrating a vector network analyzer wherein an uncalibrated port is connected via an unknown reciprocal through with an already calibrated port. The method only requires a known set of terminations (e.g. a Short, Open and Load) to be connected to a first port. This allows calibrating this first port. Next an unknown reciprocal through is used to transfer the one-port calibration from this first port (referred to as port 1) to a port k. A different (unknown) through can be used for each port. Again two sources are used to actively synthesize at least six different terminations presented to port k. Taking into account that only the corresponding termination at port 1 is known and combining the above equations (1) and (4), one has to solve a set of non-linear equations as indicated in (6):

$$\frac{(S_{12}^2 - S_{11} \cdot S_{22}) \cdot \Gamma_1^i + S_{22}}{1 - S_{11} \cdot \Gamma_1^i} = \frac{\beta_k \cdot x_{k1m}^i + \gamma_k \cdot x_{k2m}^i}{x_{k1m}^i + \alpha_k \cdot x_{k2m}^i}, \quad (6)$$
$$i = 1 \ldots 6$$

Given the calibrated terminations $\Gamma_1^i$ as measured at port 1 and the corresponding raw measurement data $x_{k1m}^i$ and $x_{k2m}^i$ at port k, (6) has to be solved with respect to $S_{11}$, $S_{12}$, $S_{22}$, $\alpha_k$, $\beta_k$ and $\gamma_k$. The challenge here is to have good starting values, especially with respect to $S_{12}$. The remaining parameter $K_k$ is obtained by performing a forward measurement.

The same principles governing the above embodiments can be applied in yet another approach, if the reference port (typically port 1) is calibrated in an absolute way (i.e. after performing a relative, power and phase calibration). In principle only two additional measurements must be performed to calibrate any additional port, assuming the through is known and assuming both measurements are sufficiently independent. For each of these measurements, both $a_1(f)$ and $b_1(f)$ are known in an absolute way (instead of only their ratio). Given the S-parameters of the through, also the corresponding $a_l(f)$ and $b_l(f)$ are known. Applying an appropriate signal to both port 1 and port l, two independent measurements allow solving $$\begin{pmatrix} a_l^1 & a_l^2 \\ b_l^1 & b_l^2 \end{pmatrix} = K_l \begin{pmatrix} 1 & \alpha_l \\ \beta_l & \gamma_l \end{pmatrix} \begin{pmatrix} x_{lm1}^1 & x_{lm1}^2 \\ x_{lm2}^1 & x_{lm2}^2 \end{pmatrix} \quad (7)$$

$\alpha_l$, $\beta_l$, $\gamma_l$ and $K_l$ can be extracted using (7) based on two measurements (indicated by superscript 1 and 2).

The skilled person will readily appreciate that for all the above one can use voltage and current or any other relevant combination instead of incident and reflected waves.

Figure 1:
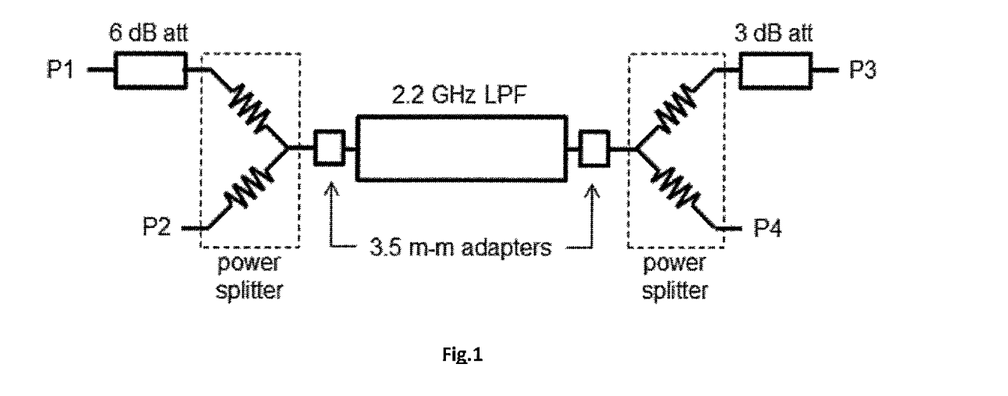
FIG. 1 illustrates a 4-port device used to verify the method according to the invention.

The "standard waveform-based" calibration method and the calibration method according to this invention are verified using a commercial 4-port Vector Network Analyzer by comparing the S-parameters of a passive 4-port device (FIG. 1) which has four female connectors. The device is measured using a frequency sweep from 100 MHz up to 4 GHz with a frequency spacing of 100 MHz and an IF bandwidth of 100 Hz.

First the 4-port SOLT calibration as provided by the instrument, which uses the 10-term error model, is performed using a high-precision 3.5 mm female-female adapter as unknown through between each port combination. Next, the equivalent standard calibration as described in the background section is performed. In order to stress this implementation, a different unknown reciprocal through was used between port 1 and each other port: the same high-precision 3.5 mm female-female adapter as above for port 2, combining the adapter with a 6 dB attenuator for port 3 and combining two adapters and a cable of about 30 cm for port 4. Finally, the proposed calibration method of this invention is used. First a known Short, Open and Load is connected at both port 1 and port 2. The high-precision 3.5 mm female-female adapter is used as unknown through between port 1 and port 2. Next that same through is used between port 1 and port 3, respectively port 4, using the first source of the VNA to apply a signal at port 1 and the second source to simultaneously apply a signal at port 3 and port 4, respectively.

Ideally the phase of the first source is adjustable with respect to the second source in order to synthesize sufficiently different mismatches as an active equivalent of a Short and an Open at port 3 and port 4, respectively, such that a well-conditioned set of equations is obtained. When phase adjustment is not supported, a different but a priori unknown and as such possibly less ideal phase relationship between both sources can be achieved by changing the frequency of one or more sources and then returning to the original frequency.

The latter approach is applied to obtain the measurement results. Three different measurements are performed specifying an identical power value for both sources in combination with a random phase relationship. It is also possible to apply a different mismatch by changing its amplitude. Hence, the power at port 1 is reduced by 6 dB and an additional measurement is performed. Adding a measurement where the source at port 1 is disabled as replacement for connecting a Load at port 3, respectively port 4, one ends up with an overdetermined set of 5 equations in 3 unknowns, which can be solved in a least-squares sense using a singular value decomposition (SVD). The singular values can be used as verification of the fact that the measurements are sufficiently independent or—otherwise stated—that the synthesized mismatches at port 3 and port 4, respectively, are sufficiently different. Finally, a sixth measurement is performed where the source at port 3 and port 4, respectively, is disabled as part of a forward measurement and allows scaling the normalized error coefficients at these ports with respect to those at port 1.

Figure 2:
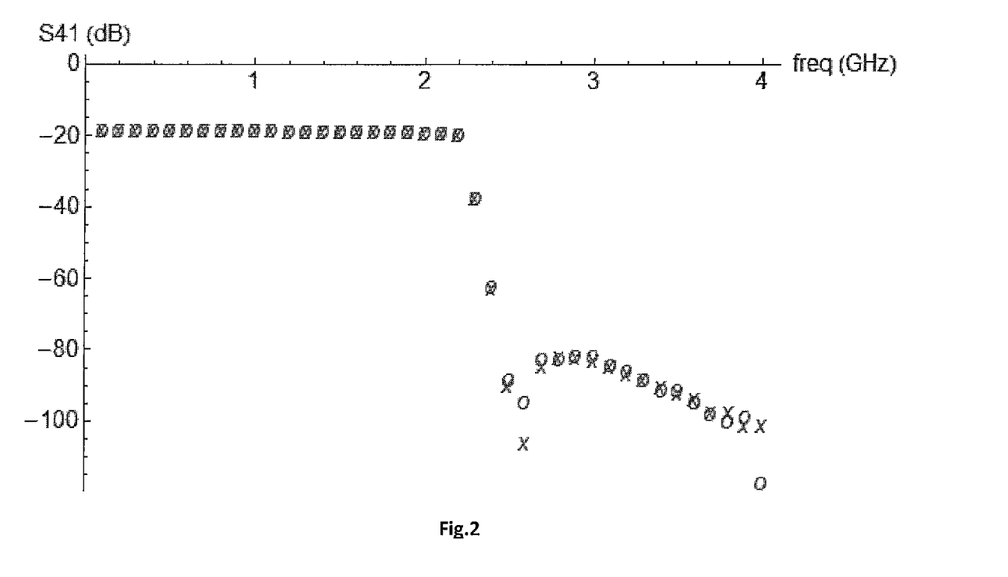
FIG. 2 illustrates a comparison of the amplitude of $S_{41}$ provided by a commercial 4-port Vector Network Analyzer (VNA) (indicated with 'x') and derived with a standard calibration approach using a wave formalism concept (indicated with 'o').
Figure 3:
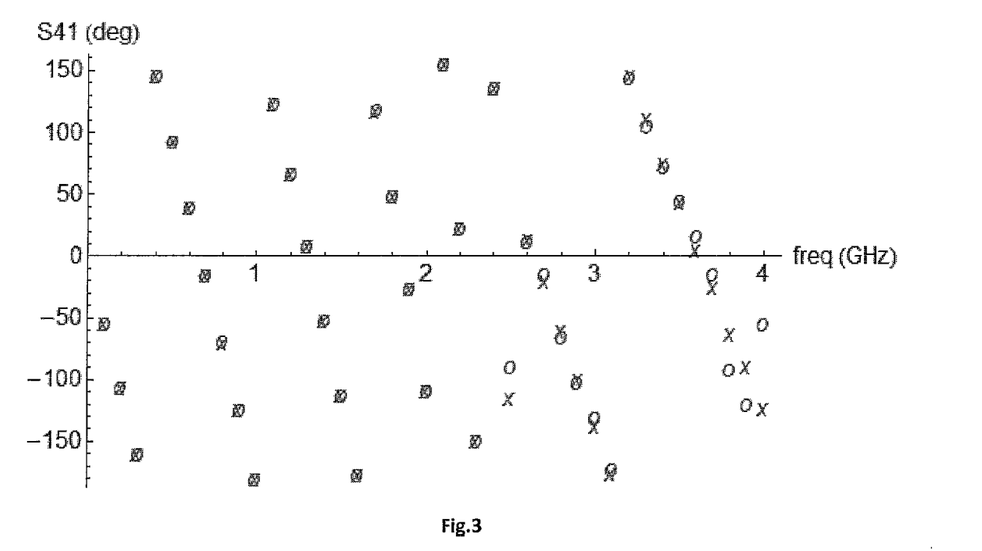
FIG. 3 illustrates a comparison of the phase of $S_{41}$ provided by a commercial VNA (indicated with 'x') and derived with a standard calibration approach using a wave formalism concept (indicated with 'o').

FIG. 2 and FIG. 3 show a comparison of the $S_{41}$ parameter of the DUT (FIG. 1) both in amplitude and phase between the values provided by the instrument and the values obtained using a standard calibration using the wave formalism concept.

Figure 4:
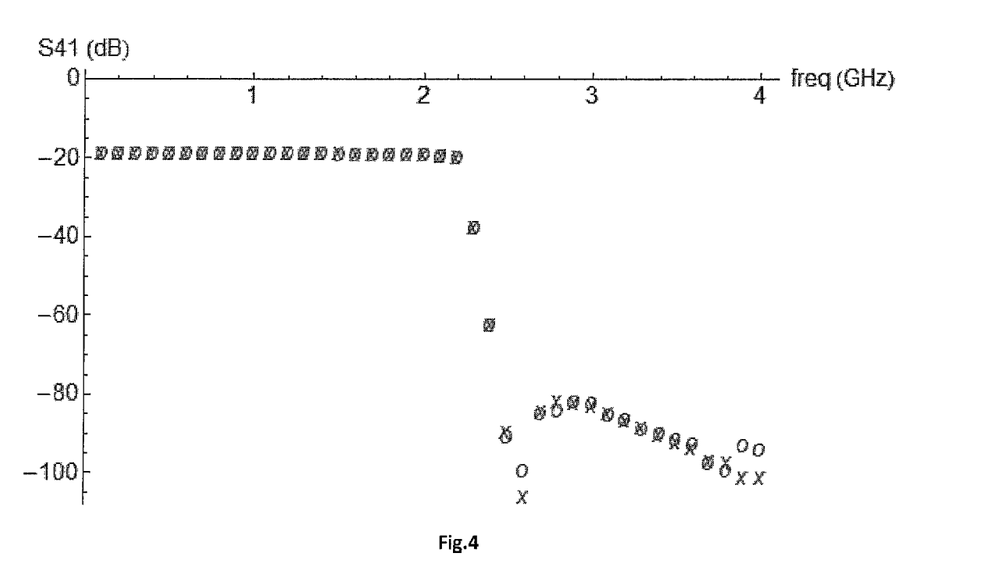
FIG. 4 illustrates a comparison of the amplitude of $S_{41}$ provided by a commercial VNA (indicated with 'x') and derived with the method of the invention (indicated with 'o').
Figure 5:
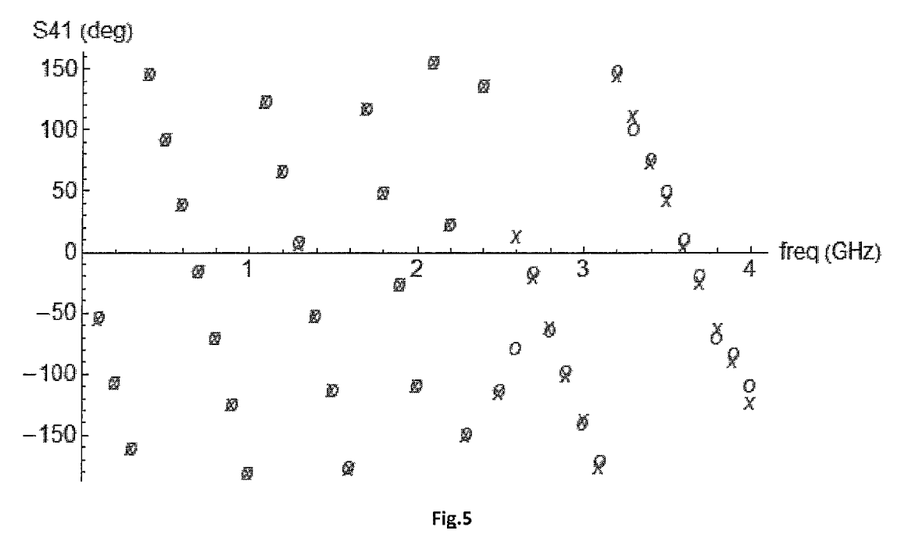
FIG. 5 illustrates a comparison of the phase of $S_{41}$ provided by a commercial VNA (indicated with 'x') and derived with the method of the invention (indicated with 'o').
Figure 6:
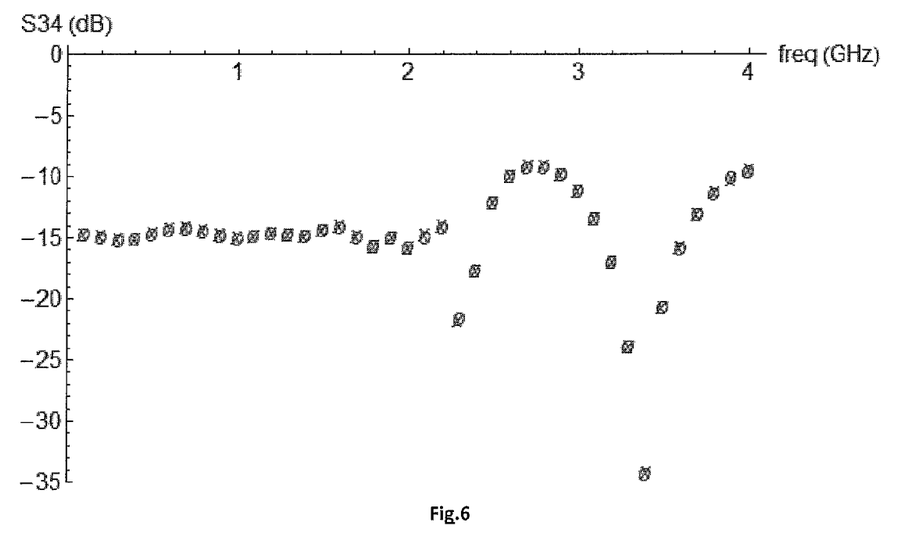
FIG. 6 illustrates a comparison of the amplitude of $S_{34}$ provided by a commercial VNA (indicated with 'x') and derived with the method of the invention (indicated with 'o').

FIG. 4 up to FIG. 6 show an equally excellent match between the S-parameters provided by the instrument and the values obtained using the "active" equivalent as described as part of the invention.

Observing a smoother amplitude and phase characteristic of S41 in the stop band as provided by the instrument (FIG. 2 up to FIG. 5), it should be kept in mind that a through is connected between each port combination during the built-in calibration, while this is not the case for the other methods. When comparing the $S_{41}$ as provided by the standard calibration and its "active" equivalent, it makes sense to remember that the latter uses 5 measurements instead of 3 when performing the standard Short, Open and Load measurements.

Figure 7:
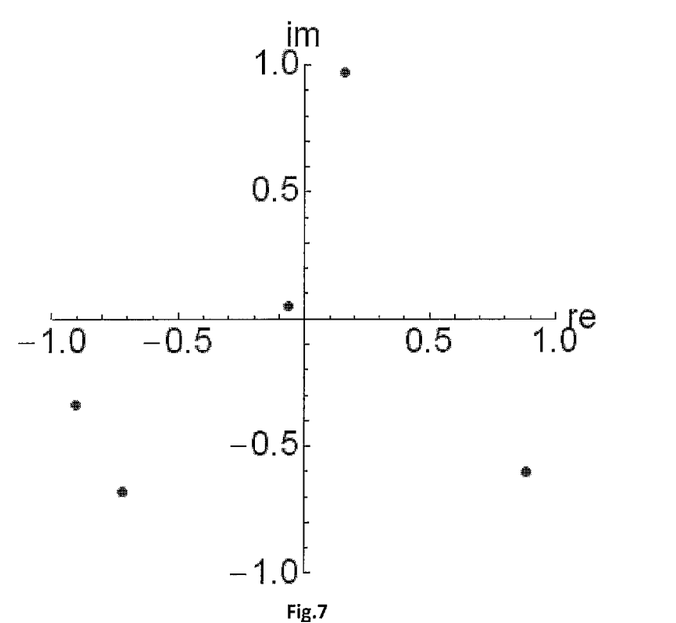
FIG. 7 illustrates the equivalent of a load and different mismatches synthesized at port 3 by applying equal power to both ports using four different random unknown phase relationships.

Finally FIG. 7 provides an idea of the different mismatches synthesized at port 3 by applying equal power to both ports using four different random unknown phase relationships. Also the equivalent of a load is included (source at port 1 disabled).

Using a wave formalism concept, a novel calibration method for a vector network analyser has been described, which can be seen as an alternative implementation of a SOLT-based N-port calibration method. It no longer requires connecting a known Short, Open and Load to each port. Instead a second source is used to synthesize different terminations while inserting a through between a port which is already calibrated and each additional port. The proposed solution is particularly advantageous for N-port VNAs where N is rather large and allows reducing the number of required one-port connections significantly.

Figure 8:
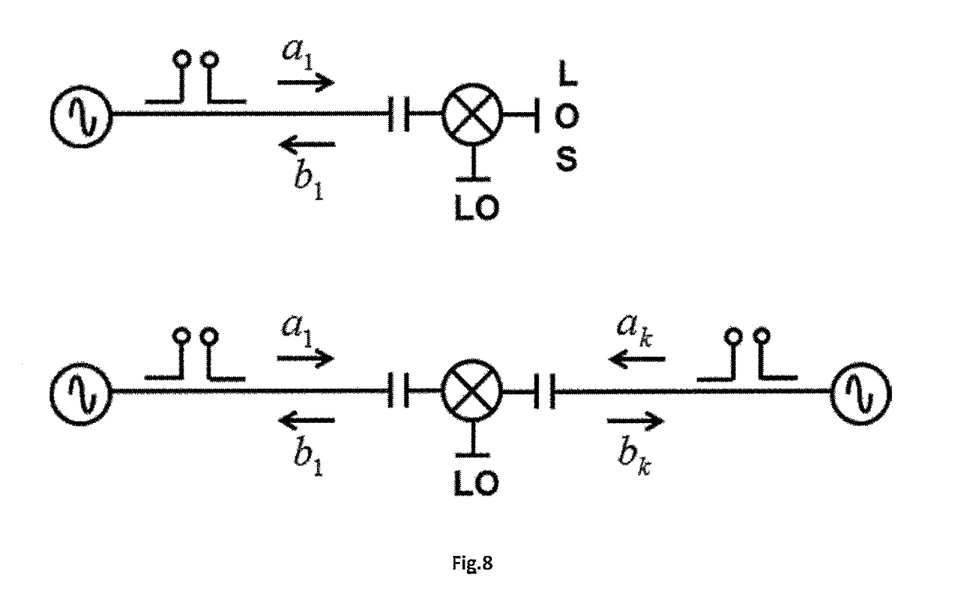
FIG. 8 illustrates a method for determining the S-parameters of a frequency translating device. The upper part shows a prior art solution and the bottom part applies the approach of this invention.

The invention as proposed can be applied in a calibration procedure for a mixer or, more generally, any frequency translating device. To measure the S-parameters of a mixer, which is assumed to be reciprocal, one usually proceeds as follows: a first port of the mixer is connected to a calibrated port of a vector network analyzer and a Load, Open and Short is connected to a second port of the mixer (with a local oscillator being connected to the corresponding port of the mixer), one at a time, in order to extract the S-parameters of the mixer. The upper part of FIG. 8 provides an illustration.

Employing the invention a different approach can be adopted exploiting a vector network analyzer containing a plurality of ports and signal sources and where at least two ports are calibrated using any relevant method. This implies that the at least two VNA ports may have been calibrated using a method as disclosed in this description or by applying another suitable method. A first port of the mixer is connected to a first calibrated VNA port, while a second port of the mixer is connected to a second calibrated VNA port, while a local oscillator is connected to the corresponding port of the mixer (see bottom part of FIG. 8). By applying a first signal to the first VNA port and a second signal to the second VNA port, it is possible to synthesize different terminations with respect to the second port of the mixer by manipulating the first and second source so that a well-conditioned set of equations is obtained. This well-conditioned set of equations allows extracting the S-parameters of the mixer, which is assumed to be reciprocal.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method for calibrating a vector network analyzer, said vector network analyzer comprising a plurality of ports and a plurality of signal sources, the method comprising:
    performing a first set of measurements using a set of known terminations connected to a first port of said plurality so that a well-conditioned set of equations is obtained,
    determining error coefficients for said first port by solving said well-conditioned set of equations, thereby obtaining a first calibrated port,
    for at least one uncalibrated port of said plurality of ports performing:
        establishing a connection via a known through between an already calibrated port and said uncalibrated port,
        applying to said already calibrated port a first signal from a first source of said plurality of signal sources and to said uncalibrated port a second signal from a second source of said plurality of signal sources,
        performing a further set of measurements using a set of terminations being realized with respect to said uncalibrated port by manipulating said first and second source so that a further well-conditioned set of equations is obtained,
        determining error coefficients for said uncalibrated port by solving said further well-conditioned set of equations, including their relation with respect to said error coefficients at said already calibrated port, such that said uncalibrated port becomes a calibrated port.

2. The method for calibrating a vector network analyzer as in claim 1, wherein said second signal source is phase-controllable with respect to said first signal source.

3. The method for calibrating a vector network analyzer as in claim 2, wherein the phase of the second signal source is changed with respect to the first signal source by setting the second signal source shortly from a first to a second frequency and then applying the first frequency again.

4. The method for calibrating a vector network analyzer as in claim 1, where said first set of measurements corresponds to applying a short, an open and a load.

5. The method for calibrating a vector network analyzer as in claim 1, wherein manipulating said first and second source comprises adapting amplitude and/or phase of the applied signals.

6. The method for calibrating a vector network analyzer as in claim 1, wherein manipulating said first and second source comprises disabling said first or second signal source.

7. The method for calibrating a vector network analyzer as in claim 1, wherein said second source is obtained by reusing said first source in combination with a splitting means for splitting said second signal and adjustment means to adjust amplitude and/or phase of said second signal with respect to said first signal.

8. The method for calibrating a vector network analyzer as in claim 1, wherein an unknown reciprocal through is used instead of said known through, said unknown reciprocal through being connected between two ports of said plurality of ports, and wherein the calibration of said first port is replaced by:
  performing a set of measurements using a set of known terminations connected to said two ports and an additional set of measurements with said unknown reciprocal through connected between said two ports, so that a well-conditioned set of equations is obtained,
  determining error coefficients for said two ports, by solving said well-conditioned set of equations, thereby obtaining two calibrated ports,
  determining the S-parameters of said unknown reciprocal through such that it becomes a known through when used between an already calibrated port and a yet to be calibrated port of said plurality of ports.

9. The method for calibrating a vector network analyzer as in claim 8, said set of measurements corresponding to applying a short, an open and a load to said two ports.

10. A method for calibrating a vector network analyzer, said vector network analyzer comprising a plurality of ports and a plurality of signal sources, the method comprising:
  performing a first set of measurements using a set of known terminations connected to a first port of said plurality so that a well-conditioned set of equations is obtained,
  determining error coefficients for said first port by solving said well-conditioned set of equations, thereby obtaining a first calibrated port,
  for an uncalibrated port of said plurality of ports performing:
    establishing a connection via an unknown reciprocal through between an already calibrated port and said uncalibrated port,
    applying to said already calibrated port a first signal from a first source of said plurality of signal sources and to said uncalibrated port a second signal from a second source of said plurality of signal sources,
    performing an extended set of measurements using a set of terminations being realized with respect to said uncalibrated port by manipulating said first and second source so that a further well-conditioned extended set of equations is obtained,
    determining error coefficients for said uncalibrated port by solving said further well-conditioned extended set of equations, including their relation with respect to said error coefficients at said already calibrated port, such that said uncalibrated port becomes a calibrated port.

11. A method for determining S-parameters of a frequency translating device with a vector network analyzer, said vector network analyzer comprising a plurality of ports and a plurality of signal sources, the method comprising:
  calibrating at least two ports of said vector network analyzer,
  connecting, while a local oscillator is connected to said frequency translating device, a first port of said frequency translating device to a first calibrated port of said vector network analyzer and a second port of said frequency translating device to a second calibrated port of said vector network analyzer,
  applying a first signal from a first source of said plurality of signal sources to said first calibrated port and a second signal from a second source of said plurality of signal sources to said second calibrated port,
  synthesizing a set of terminations with respect to said second port of said frequency translating device by manipulating said first and second source so that a well-conditioned set of equations is obtained,
  extracting the S-parameters of said frequency translating device by solving said well-conditioned set of equations.

* * * * *